United States Patent
Bour et al.

(10) Patent No.: US 7,364,991 B2
(45) Date of Patent: Apr. 29, 2008

(54) BUFFER-LAYER TREATMENT OF MOCVD-GROWN NITRIDE STRUCTURES

(75) Inventors: David Bour, Cupertino, CA (US); Jacob Smith, Santa Clara, CA (US); Sandeep Nijhawan, Los Altos, CA (US)

(73) Assignee: Applied Materials, Inc., Santa Clara, CA (US)

(*) Notice: Subject to any disclaimer, the term of this patent is extended or adjusted under 35 U.S.C. 154(b) by 202 days.

(21) Appl. No.: 11/414,012

(22) Filed: Apr. 27, 2006

(65) Prior Publication Data

US 2007/0254458 A1    Nov. 1, 2007

(51) Int. Cl.
*H01L 21/20* (2006.01)
*H01L 21/36* (2006.01)
*H01L 31/20* (2006.01)

(52) U.S. Cl. .................... 438/483; 438/486
(58) Field of Classification Search ............ 438/483, 438/486

See application file for complete search history.

(56) References Cited

U.S. PATENT DOCUMENTS

| 2002/0155683 | A1* | 10/2002 | Tsvetkov et al. ........... 438/483 |
| 2004/0036086 | A1* | 2/2004 | Khan et al. ................ 257/200 |
| 2004/0065887 | A1* | 4/2004 | Sato et al. ................. 257/79 |
| 2006/0286782 | A1* | 12/2006 | Gaska et al. .............. 438/483 |

* cited by examiner

*Primary Examiner*—Michael Lebentritt
*Assistant Examiner*—Kenisha V Ford
(74) *Attorney, Agent, or Firm*—Townsend and Townsend and Crew

(57) ABSTRACT

Methods are disclosed for fabricating a compound nitride semiconductor structure. An amorphous buffer layer that includes nitrogen and a group-III element is formed over a substrate disposed within a substrate processing chamber at a first temperature. The temperature within the chamber is increased to a second temperature at which the amorphous buffer layer coalesces into crystallites over the substrate. The substrate is exposed to a corrosive agent to destroy at least some of the crystallites. A crystalline nitride layer is formed over the substrate at a third temperature using the crystallites remaining after exposure to the corrosive agent as seed crystals. The third temperature is greater than the first temperature. The crystalline nitride layer also includes nitrogen and a group-III element.

18 Claims, 3 Drawing Sheets

BUFFER-LAYER TREATMENT OF MOCVD-GROWN NITRIDE STRUCTURES

BACKGROUND OF THE INVENTION

The history of light-emitting diodes ("LEDs") is sometimes characterized as a "crawl up the spectrum." This is because the first commercial LEDs produced light in the infrared portion of the spectrum, followed by the development of red LEDs that used GaAsP on a GaAs substrate. This was, in turn, followed by the use of GaP LEDs with improved efficiency that permitted the production of both brighter red LEDs and orange LEDs. Refinements in the use of GaP then permitted the development of green LEDs, with dual GaP chips (one in red and one in green) permitting the generation of yellow light. Further improvements in efficiency in this portion of the spectrum were later enabled through the use of GaAlAsP and InGaAlP materials.

This evolution towards the production of LEDs that provide light at progressively shorter wavelengths has generally been desirable not only for its ability to provide broad spectral coverage but because diode production of short-wavelength light may improve the information storage capacity of optical devices like CD-ROMs. The production of LEDs in the blue, violet, and ultraviolet portions of the spectrum was largely enabled by the development of nitride-based LEDs, particularly through the use of GaN. While some modestly successful efforts had previously been made in the production of blue LEDs using SiC materials, such devices suffered from poor luminescence as a consequence of the fact that their electronic structure has an indirect bandgap.

While the feasibility of using GaN to create photoluminescence in the blue region of the spectrum has been known for decades, there were numerous barriers that impeded their practical fabrication. These included the lack of a suitable substrate on which to grow the GaN structures, generally high thermal requirements for growing GaN that resulted in various thermal-convection problems, and a variety of difficulties in efficient p-doping such materials. The use of sapphire as a substrate was not completely satisfactory because it provides approximately a 15% lattice mismatch with the GaN. Progress has subsequently been made in addressing many aspects of these barriers. For example, the use of a buffer layer of AlN or GaN formed from a metalorganic vapor has been helpful in accommodating the lattice mismatch. Further refinements in the production of GaN-based structures has included the use of AlGaN materials to form heterojunctions with GaN and particularly the use of InGaN, which causes the creation of defects that act as quantum wells to emit light efficiently at short wavelengths. Indium-rich regions have a smaller bandgap than surrounding material, and may be distributed throughout the material to provide efficient emission centers.

While some improvements have thus been made in the manufacture of such compound nitride semiconductor devices, it is widely recognized that a number of deficiencies yet exist in current manufacturing processes. Moreover, the high utility of devices that generate light at such wavelengths has caused the production of such devices to be an area of intense interest and activity. In view of these considerations, there is a general need in the art for improved methods and systems for fabricating compound nitride semiconductor devices.

BRIEF SUMMARY OF THE INVENTION

Embodiments of the invention provide methods of fabricating a compound nitride semiconductor structure. An amorphous buffer layer is formed over a substrate disposed within a substrate processing chamber at a first temperature. The amorphous buffer layer comprises a first group-III element and nitrogen. A temperature within the substrate processing chamber is increased to a second temperature at which the amorphous buffer layer coalesces into a plurality of crystallites over the substrate. The substrate is exposed to a corrosive agent to destroy at least some of the crystallites. A crystalline nitride layer is formed over the substrate at a third temperature using the crystallites remaining after exposing the substrate to the corrosive agent as seed crystals. The third temperature is greater than the first temperature. The crystalline nitride layer comprises a second group-III element and nitrogen.

In some embodiments, the amorphous buffer layer is formed by flowing a first group-III precursor and a first nitrogen precursor into the substrate processing chamber. The first group-III precursor comprises the first group-III element. The amorphous buffer layer is then deposited over the substrate with a first thermal chemical-vapor-deposition process within the substrate processing chamber using the first group-III precursor and the first nitrogen precursor. In such processing, the first temperature may sometimes be less than 700° C.

The crystalline nitride layer may be formed by flowing a second group-III precursor and a second nitrogen precursor into the substrate processing chamber, with the second group-III precursor comprising the second group-III element. The crystalline nitride layer is deposited over the substrate with a second thermal chemical-vapor-deposition process within the substrate processing chamber using the second group-III precursor and the second nitrogen precursor. In such processes, the third temperature may be greater than 900° C. In some embodiments, the first and second group-III elements comprise Ga. The amorphous buffer layer and the crystalline nitride layer may have substantially the same chemical composition.

In one embodiment, the substrate is transferred from the substrate processing chamber to a second substrate processing chamber different from the substrate processing chamber. A third group-III precursor and a third nitrogen precursor are flowed into the second substrate processing chamber. The third group-III precursor comprises a third group-III element different from the second group-III element. A second nitride layer is deposited over the crystalline nitride layer with a third chemical-vapor-deposition process within the second processing chamber using the third group-III precursor and the third nitrogen precursor.

The substrate may be exposed to the corrosive agent by flowing a halogen precursor into the substrate processing chamber, one example of which is HCl. In some embodiments, the third temperature is approximately equal to the second temperature. In one specific embodiment, the substrate comprises a sapphire substrate.

BRIEF DESCRIPTION OF THE DRAWINGS

A further understanding of the nature and advantages of the present invention may be realized by reference to the remaining portions of the specification and the drawings wherein like reference numerals are used throughout the several drawings to refer to similar components. In some instances, a sublabel is associated with a reference numeral and follows a hyphen to denote one of multiple similar components. When reference is made to a reference numeral without specification to an existing sublabel, it is intended to refer to all such multiple similar components.

DETAILED DESCRIPTION OF THE INVENTION

1. Overview

One of the difficulties mentioned above in fabricating nitride-based structures such as GaN structures is the accommodation of generally high thermal requirements for growth of GaN. Historically, this made the identification of a suitable substrate difficult, with the art more recently focusing on ways in which the use of sapphire $Al_2O_3$ may be accommodated. Sapphire is not an ideal substrate because there is a significant lattice mismatch with deposited nitride layers; in the specific case of GaN, this lattice mismatch is approximately 15%. While the use of a nitride buffer layer has been helpful in accommodating the lattice mismatch, both the lattice mismatch and other physical differences between the sapphire substrate and overlying nitride layer continue to present difficulties in forming high-quality crystalline nitride layers without a significant dislocation density.

Figure 1:
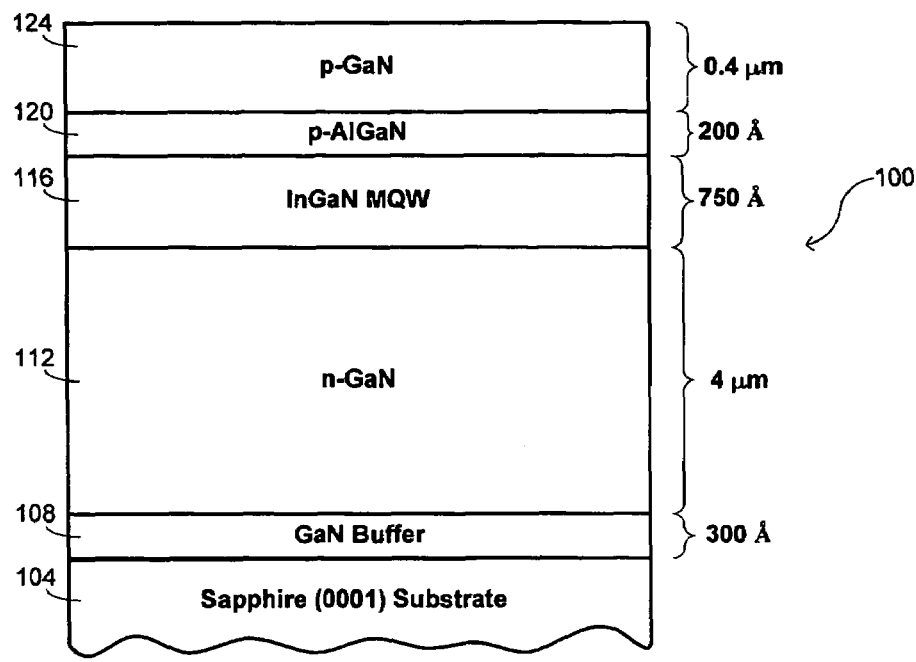
FIG. 1 provides a schematic illustration of a structure of a GaN-based LED.

One typical nitride-based structure is illustrated in FIG. 1 as a GaN-based LED structure 100. It is fabricated over a sapphire (0001) substrate 104. An n-type GaN layer 112 is deposited over a GaN buffer layer 108 formed over the substrate. An active region of the device is embodied in a multi-quantum-well layer 116, shown in the drawing to comprise an InGaN layer. A pn junction is formed with an overlying p-type AlGaN layer 120, with a p-type GaN layer 124 acting as a contact layer.

A typical fabrication process for such an LED may use a metalorganic chemical-vapor-deposition ("MOCVD") process that follows cleaning of the substrate 104 in a processing chamber. The MOCVD deposition is accomplished by providing flows of suitable precursors to the processing chamber and using thermal processes to achieve deposition. For example, a GaN layer may be deposited using Ga and N precursors, perhaps with a flow of a fluent gas like $N_2$, $H_2$, and/or $NH_3$; an InGaN layer may be deposited using Ga, N, and In precursors, perhaps with a flow of a fluent gas; and an AlGaN layer may be deposited using Ga, N, and Al precursors, also perhaps with a flow of a fluent gas. In the illustrated structure 100, the GaN buffer layer 108 has a thickness of about 300 Å, and may have been deposited at a temperature of about 550° C. Subsequent deposition of the n-GaN layer 112 is typically performed at a higher temperature, such as around 1050° C. in one embodiment. The n-GaN layer 112 is relatively thick, with deposition of a thickness on the order of 4 μm requiring about 140 minutes. The InGaN multi-quantum-well layer 116 may have a thickness of about 750 Å, which may be deposited over a period of about 40 minutes at a temperature of about 750° C. The p-AlGaN layer 120 may have a thickness of about 200 Å, which may be deposited in about five minutes at a temperature of 950° C. The thickness of the contact layer 124 that completes the structure may be about 0.4 μm in one embodiment, and may be deposited at a temperature of about 1050° C. for around 25 minutes.

Even including the relatively low-temperature deposition of a buffer layer 108 in this way, such a fabrication process still results in a dislocation density of about $10^9$ cm$^{-3}$ in the n-GaN layer 112. The high dislocation density is a result of the lattice mismatch between the substrate and the crystalline layer, and the dislocations have a direct adverse effect on device performance. In light-emitting devices, the dislocations represent extended nonradiative defects that act to reduce the internal quantum efficiency; they are also involved in device failure. In electronic devices, the presence of the dislocations can cause failure or premature breakdown at high bias voltages.

The inventors have recognized that one source for the deficiencies in growth of the crystalline nitride layer 112 can be traced to significant variation in the quality of crystallites that form from the buffer layer when the temperature is raised from the lower buffer-layer deposition temperature to the higher nitride growth temperature. Specifically, when the buffer layer 108 is deposited at a lower temperature around 400-700° C., it forms as an amorphous layer that wets the surface of the substrate 104 in a substantially uniform manner. This layer is accordingly sometimes referred to in the art as a "wetting layer" or as a "nucleation layer." When the temperature is raised to the 900-1500° C. temperature at which the crystalline layer is to be grown, the amorphous buffer layer 108 undergoes a transformation in which the amorphous material becomes crystalline. Portions of the layer 108 coalesce into small crystallites, each of which is ideally in epitaxial alignment with the underlying substrate 104. In actual fabrication processes, however, many of the crystallites that form are imperfect for one or more reasons—they are not in hexagonal phase when the underlying substrate 104 is sapphire, the are small and ill-formed, they have misalignments with the crystalline structure of the substrate 104, and the like.

Embodiments of the invention improve the overall quality of the crystallites that form in this way by exploiting the fact that the less-well-formed crystallites are generally expected to be more susceptible to etching. Exposure to a corrosive agent is accordingly used to destroy many of the less-well-formed crystallites and to leave at least portions of the better-formed crystallites. Subsequent deposition of the thick nitride layer 112 then proceeds with the better-formed crystallites acting and seed crystals to improve the overall quality of the layer 112.

2. Exemplary Substrate Processing System

Figure 2:
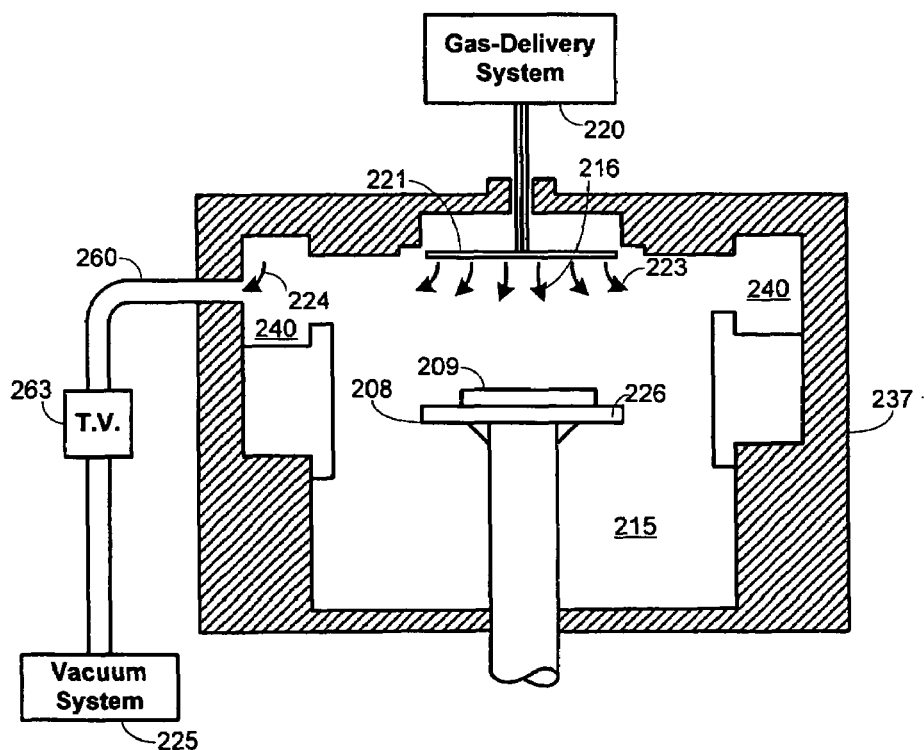
FIG. 2 is a simplified representation of an exemplary CVD apparatus that may be used in implementing certain embodiments of the invention.

FIG. 2 is a simplified diagram of an exemplary chemical vapor deposition ("CVD") system, illustrating the basic structure of a chamber in which individual deposition steps can be performed. This system is suitable for performing thermal, sub-atmospheric CVD ("SACVD") processes, as well as other processes, such as reflow, drive-in, cleaning, etching, deposition, and gettering processes. In some instances multiple-step processes can still be performed within an individual chamber before removal for transfer to another chamber. The major components of the system include, among others, a vacuum chamber 215 that receives process and other gases from a gas delivery system 220, a vacuum system 225, and a control system (not shown). These and other components are described in more detail below. While the drawing shows the structure of only a single chamber for purposes of illustration, it will be appreciated that multiple chambers with similar structures may be provided as part of a cluster tool, each tailored to perform different aspects of certain overall fabrication processes.

The CVD apparatus includes an enclosure assembly 237 that forms vacuum chamber 215 with a gas reaction area 216. A gas distribution structure 221 disperses reactive gases and other gases, such as purge gases, toward one or more substrates 209 held in position by a substrate support structure 208. Between gas distribution structure 221 and the substrate 209 is gas reaction area 216. Heaters 226 can be controllably moved between different positions to accommodate different deposition processes as well as for an etch or cleaning process. A center board (not shown) includes sensors for providing information on the position of the substrate.

Different structures may be used for heaters 226. For instance, some embodiments of the invention advantageously use a pair of plates in close proximity and disposed on opposite sides of the substrate support structure 208 to provide separate heating sources for the opposite sides of one or more substrates 209. Merely by way of example, the plates may comprise graphite or SiC in certain specific embodiments. In another instance, the heaters 226 include an electrically resistive heating element (not shown) enclosed in a ceramic. The ceramic protects the heating element from potentially corrosive chamber environments and allows the heater to attain temperatures up to about 1200° C. In an exemplary embodiment, all surfaces of heaters 226 exposed to vacuum chamber 215 are made of a ceramic material, such as aluminum oxide ($Al_2O_3$ or alumina) or aluminum nitride. In another embodiment, the heaters 226 comprises lamp heaters. Alternatively, a bare metal filament heating element, constructed of a refractory metal such as tungsten, rhenium, iridium, thorium, or their alloys, may be used to heat the substrate. Such lamp heater arrangements are able to achieve temperatures greater than 1200° C., which may be useful for certain specific applications.

Reactive and carrier gases are supplied from gas delivery system 220 through supply lines to the gas distribution structure 221. In some instances, the supply lines may deliver gases into a gas mixing box to mix the gases before delivery to the gas distribution structure. In other instances, the supply lines may deliver gases to the gas distribution structure separately, such as in certain showerhead configurations described below. Gas delivery system 220 includes a variety of gas sources and appropriate supply lines to deliver a selected amount of each source to chamber 215 as would be understood by a person of skill in the art. Generally, supply lines for each of the gases include shut-off valves that can be used to automatically or manually shut-off the flow of the gas into its associated line, and mass flow controllers or other types of controllers that measure the flow of gas or liquid through the supply lines. Depending on the process run by the system, some of the sources may actually be liquid sources rather than gases. When liquid sources are used, gas delivery system includes a liquid injection system or other appropriate mechanism (e.g., a bubbler) to vaporize the liquid. Vapor from the liquids is then usually mixed with a carrier gas as would be understood by a person of skill in the art. During deposition processing, gas supplied to the gas distribution structure 221 is vented toward the substrate surface (as indicated by arrows 223), where it may be uniformly distributed radially across the substrate surface in a laminar flow.

The gas delivery system 220 may also be equipped to provide a corrosive gas stream to the processing chamber for use in certain processes. The corrosive gas stream may comprise a halogen precursor such as HCl or HF. Further details describing structures for providing such a corrosive gas stream are provided in copending, commonly assigned U.S. patent application Ser. No. 11/429,022, entitled "PARASITIC PARTICLE SUPPRESSION IN THE GROWTH OF III-V NITRIDE FILMS USING MOCVD AND HVPE," by David Bour et al. (Attorney Docket No. A10832/T68000), the entire disclosure of which is incorporated herein by reference for all purposes.

Purging gas may be delivered into the vacuum chamber 215 from gas distribution structure 221 and/or from inlet ports or tubes (not shown) through the bottom wall of enclosure assembly 237. Purge gas introduced from the bottom of chamber 215 flows upward from the inlet port past the heater 226 and to an annular pumping channel 240. Vacuum system 225 which includes a vacuum pump (not shown), exhausts the gas (as indicated by arrows 224) through an exhaust line 260. The rate at which exhaust gases and entrained particles are drawn from the annular pumping channel 240 through the exhaust line 260 is controlled by a throttle valve system 263.

The temperature of the walls of deposition chamber 215 and surrounding structures, such as the exhaust passageway, may be further controlled by circulating a heat-exchange liquid through channels (not shown) in the walls of the chamber. The heat-exchange liquid can be used to heat or cool the chamber walls depending on the desired effect. For example, hot liquid may help maintain an even thermal gradient during a thermal deposition process, whereas a cool liquid may be used to remove heat from the system during other processes, or to limit formation of deposition products on the walls of the chamber. Gas distribution manifold 221 also has heat exchanging passages (not shown). Typical heat-exchange fluids water-based ethylene glycol mixtures, oil-based thermal transfer fluids, or similar fluids. This heating, referred to as heating by the "heat exchanger", beneficially reduces or eliminates condensation of undesirable reactant products and improves the elimination of volatile products of the process gases and other contaminants that might contaminate the process if they were to condense on the walls of cool vacuum passages and migrate back into the processing chamber during periods of no gas flow.

The system controller controls activities and operating parameters of the deposition system. The system controller may include a computer processor and a computer-readable memory coupled to the processor. The processor executes system control software, such as a computer program stored in memory. The processor operates according to system control software (program), which includes computer instructions that dictate the timing, mixture of gases, chamber pressure, chamber temperature, microwave power levels, pedestal position, and other parameters of a particular process. Control of these and other parameters is effected over control lines that communicatively couple the system controller to the heater, throttle valve, and the various valves and mass flow controllers associated with gas delivery system 220.

3. Fabrication Process with Buffer-Layer Treatment

Figure 3:
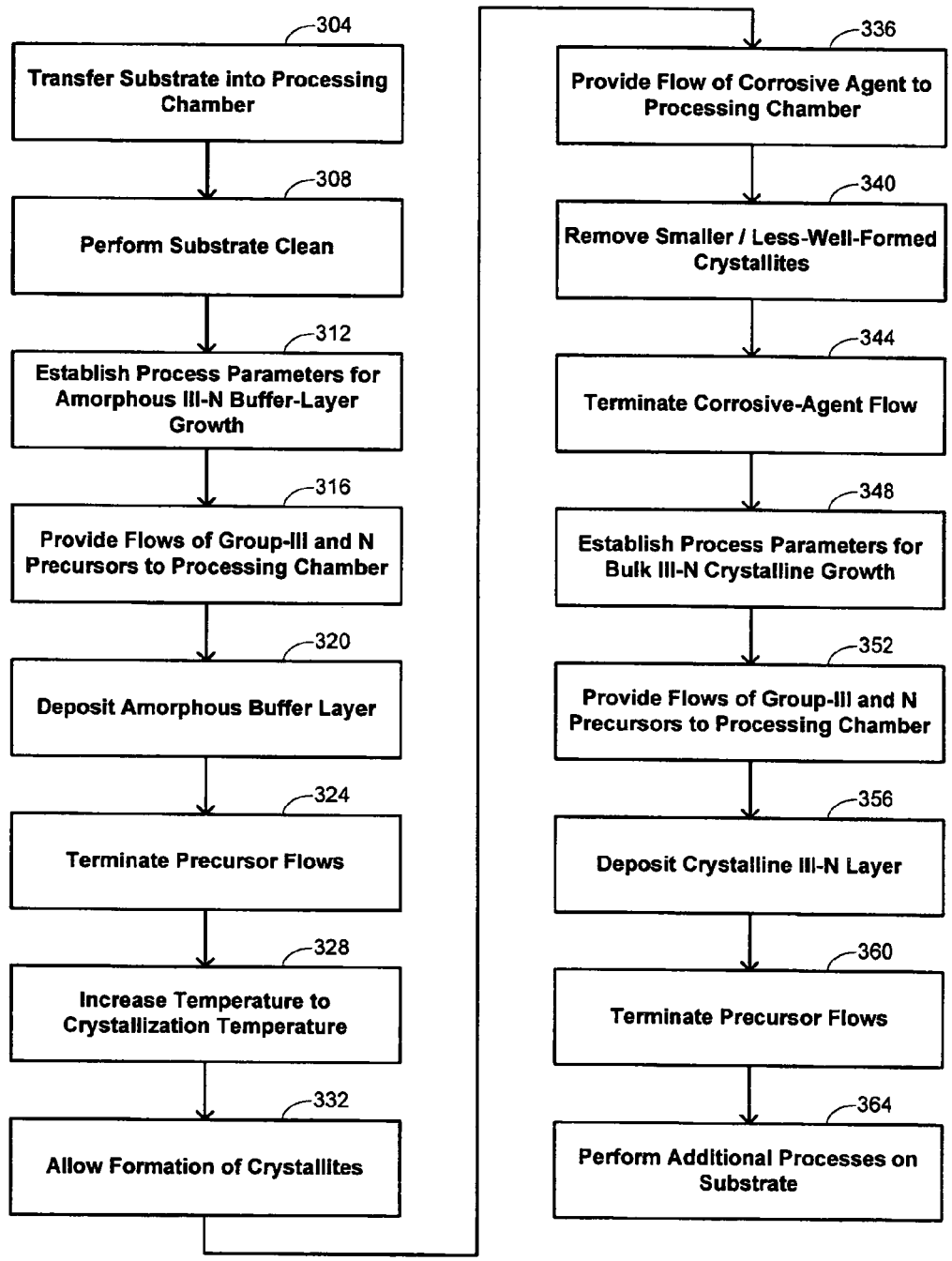
FIG. 3 is a flow diagram summarizing methods of fabricating nitride structures with a buffer-layer treatment in accordance with embodiments of the invention.

Specific methods of the invention for fabricating a nitride structure that uses a buffer-layer treatment to improve the quality of seed crystallites are summarized with the flow diagram of FIG. 3. In describing these methods, reference is sometimes also made to FIGS. 4A and 4B, which provide schematic illustrations of the crystallite structure at points during the fabrication process that are respectively before and after the buffer-layer treatment.

The method begins at block 304 by transferring a substrate into a substrate processing chamber. For deposition of a nitride structure, the substrate may comprise sapphire, although materials that may be used include SiC, Si, spinel, lithium gallate, aluminum gallate, ZnO, and others. The substrate is cleaned at block 308, after which process parameters suitable for growth of a buffer layer may be established at block 312. Such process parameters may include temperature, pressure, and the like to define an environment appropriate for thermal deposition of an amorphous nitride layer. In one embodiment, such process parameters include a temperature less than 700° C.; in other embodiments, the temperature may be less than 650° C., less than 600° C., less than 550° C., or less than 500° C. Flows of precursors are provided to the processing chamber at block 316 to deposit the amorphous buffer layer at block 320. The precursors generally include a nitrogen source and a source for a group-III element such as Ga. For instance, suitable nitrogen precursors include $NH_3$ and suitable Ga precursors include trimethyl gallium ("TMG"). The group-III element may sometimes comprise a plurality of distinct group-III elements such as Al and Ga, in which case a suitable Al precursor may be trimethyl aluminum ("TMA"); in another example, the plurality of distinct group-III elements includes In and Ga, in which case a suitable In precursor may be trimethyl indium ("TMI"). A flow of a carrier gas such as $N_2$ and/or $H_2$ may also be included.

Figure 4A:
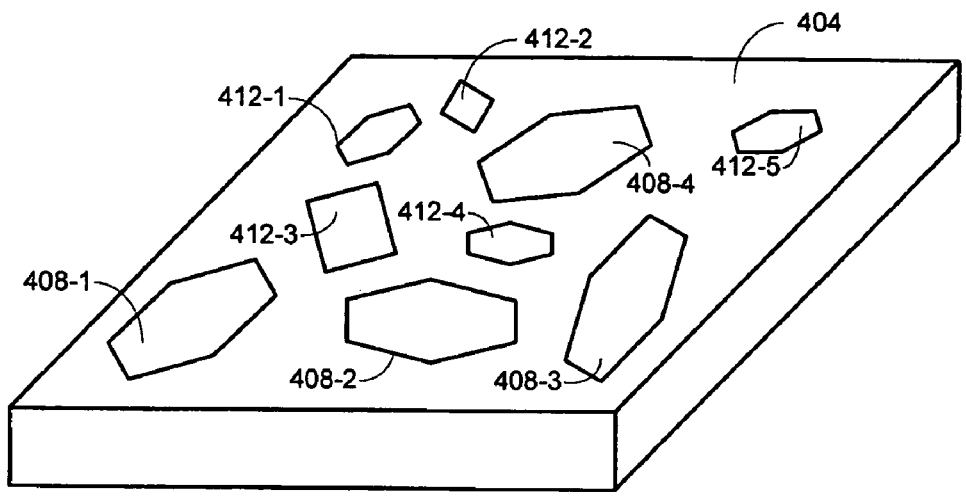
FIGS. 4A and 4B provide schematic illustrations of crystallite structures formed over a substrate before and after a buffer-layer treatment performed in accordance with embodiments of the invention.

After deposition of the amorphous buffer layer at block 320, the precursor flows are terminated at block 324. The temperature within the processing chamber is increased to a crystallization temperature at block 328. A suitable crystallization temperature may be greater than 700° C., greater than 750° C., greater than 800° C., greater than 850° C., 900° C., greater than 950° C., greater than 1000° C., greater than 1050° C., greater than 1100° C., greater than 1150° C., or greater than 1200° C. in different embodiments. The increase in temperature allows the amorphous material of the buffer layer to crystallize into small crystallites, as indicated at block 332 and as illustrated in FIG. 4A. In the schematic drawing of FIG. 4A, the substrate is denoted with reference number 404 and has a variety of crystallites formed thereover as a result of the transformation that occurs at the higher temperature. Those crystallites denoted by reference numbers 408 are considered to be well-formed and suitable seeds for subsequent growth of a crystalline nitride layer. Other crystallites, denoted by reference number 412, are consider less-well-formed because they are small, are not hexagonal, are not well aligned with the substrate crystalline structure, or the like.

Figure 4B:
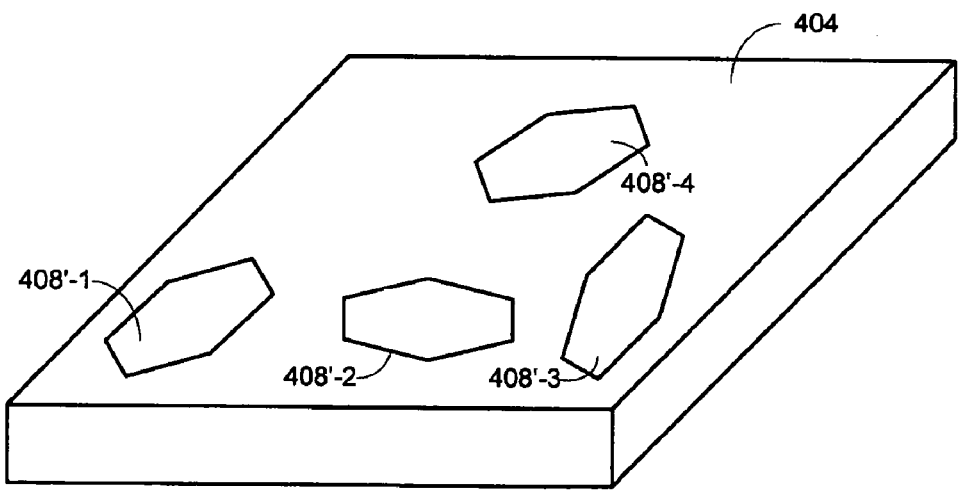

Formation of the crystallites at block 332 is followed at block 336 by providing a flow of a corrosive agent to the processing chamber. In some embodiments, the corrosive agent comprises a halogen precursor such as HCl or HF. The corrosive agent acts as an etchant on the crystallites. Because the less-well-formed crystallites 412 are more susceptible to such etching, they are preferentially removed at block 340 with at least a portion of the well-formed crystallites 408 remaining. FIG. 4B provides an illustration of the structure after exposure to the corrosive agent, with the remaining crystallites denoted by reference numbers 408' to emphasize that their structure may also be affected to some degree by exposure to the corrosive agent. The inventors believe that flows that result in a concentration on the order of one part in 100,000 to one part in 100 for a period on the order of seconds or minutes is sufficient to improve the crystallite structure adequately. This buffer-layer treatment process is completed at block 344 by terminating the flow of the corrosive agent.

With the overall crystallite structure improved by exposure to the corrosive agent, process parameters may then be established at block 348 for bulk III—N crystalline growth. In some embodiments, the temperature for such growth is approximately the same as the temperature used for crystallizing the amorphous buffer layer at block 328, but this is not required and different temperatures may be used for this different portions of the fabrication process. Suitable III—N growth temperatures in different specific embodiments are greater 900° C., greater than 950° C., greater than 1000° C., greater than 1050° C., greater than 1100° C., greater than 1150° C., or greater than 1200° C. Suitable precursor flows are provided to the processing chamber at block 352, enabling deposition of a crystalline nitride layer at block 356. It is generally expected that the nitride layer deposited at block 356 will have a similar composition to the buffer layer deposited at block 320, but this is not a requirement of the invention. More generally, the crystalline layer deposited at block 356 comprises one or more group-III elements and nitrogen, and may include additional elements as appropriate for specific applications.

The following table provides exemplary processing conditions and precursor flow rates that are generally suitable in the growth of crystalline nitride layers:

| Parameter | Value |
| --- | --- |
| Temperature (° C.) | 500-1500 |
| Pressure (torr) | 50-1000 |
| TMG flow (sccm) | 0-50 |
| TMA flow (sccm) | 0-50 |
| TMI flow (sccm) | 0-50 |
| $PH_3$ flow (sccm) | 0-1000 |
| $AsH_3$ flow (sccm) | 0-1000 |
| $NH_3$ flow (sccm) | 100-100,000 |
| $N_2$ flow (sccm) | 0-100,000 |
| $H_2$ flow (sccm) | 0-100,000 |

As will be evident from the preceding description, a process might not use flows of all the precursors in any given process. For example, growth of GaN might use flows of TMG, $NH_3$, and $N_2$ in one embodiment; growth of AlGaN might use flows of TMG, TMA, $NH_3$, and $H_2$ in another embodiment, with the relative flow rates of TMA and TMG selected to provide a desired relative Al:Ga stoichiometry of the deposited layer; and growth of InGaN might use flows of TMG, TMI, $NH_3$, $N_2$, and $H_2$ in still another embodiment, with relative flow rates of TMI and TMG selected to provide a desired relative In:Ga stoichiometry of the deposited layer.

The table also notes that group-V precursors different from nitrogen may also sometimes be included. For example, a III—N—P structure may be fabricated by including a flow of phosphine $PH_3$ or a III—N—As structure may be fabricated by including a flow of arsine $AsH_3$. The relative stoichiometry of the nitrogen to the other group-V element in the structure may be determined by suitable choices of relative flow rates of the respective precursors. In still other instances, doped compound nitride structures may be formed by including dopant precursors, particular examples of which include the use of rare-earth dopants.

After deposition of the crystalline layer at block 356, the precursor flows are terminated. This may be followed with any of a number of different processes used in fabricating a complete structure. In the fabrication of optoelectronic devices, the layer deposited at block 356 is typically an n-type layer, over which one or more active p-type layers is subsequently deposited to produce a structure like that shown in FIG. 1. Fabrication of other optoelectronic devices, including laser diodes, vertical-cavity surface-emitting lasers, horizontal-cavity surface-emitting lasers, and the like also comprises additional deposition steps. Subsequent processes performed at block 364 may be performed in the same processing chamber or may be performed in a different processing chamber configured for efficient implementation of specialized processes. The use of different processing chambers may be facilitated in certain embodiments through the use of a cluster tool having robotic structures that easily effect transfers of substrates between the different chambers during fabrication. Use of such a cluster in fabrication of nitride structures is described in detail in copending, commonly assigned U.S. patent application Ser. No. 11/404,516, entitled "EPITAXIAL GROWTH OF COMPOUND NITRIDE SEMICONDUCTOR STRUCTURES," filed by Sandeep Nijhawan et al. (Attorney Docket No. A10938/T68100), the entire disclosure of which is incorporated herein by reference for all purposes.

Having fully described several embodiments of the present invention, many other equivalent or alternative methods of producing the cladding layers of the present invention will be apparent to those of skill in the art. These alternatives and equivalents are intended to be included within the scope of the invention, as defined by the following claims.

What is claimed is:

1. A method of fabricating a compound nitride semiconductor structure, the method comprising:
    forming an amorphous buffer layer over a substrate disposed within a substrate processing chamber at a first temperature, the amorphous buffer layer comprising a first group-III element and nitrogen;
    increasing a temperature within the substrate processing chamber to a second temperature at which the amorphous buffer layer coalesces into a plurality of crystallites over the substrate;
    exposing the substrate to a corrosive agent to destroy at least some of the crystallites; and
    forming a crystalline nitride layer over the substrate at a third temperature using the crystallites remaining after exposing the substrate to the corrosive agent as seed crystals, wherein:
        the third temperature is greater than the first temperature; and
        the crystalline nitride layer comprises a second group-III element and nitrogen.

2. The method recited in claim 1 wherein forming the amorphous buffer layer comprises:
    flowing a first group-III precursor and a first nitrogen precursor into the substrate processing chamber, the first group-III precursor comprising the first group-III element; and
    depositing the amorphous buffer layer over the substrate with a first thermal chemical-vapor-deposition process within the substrate processing chamber using the first group-III precursor and the first nitrogen precursor.

3. The method recited in claim 2 wherein the first temperature is less than 700° C.

4. The method recited in claim 3 wherein forming the crystalline nitride layer comprises:
    flowing a second group-III precursor and a second nitrogen precursor into the substrate processing chamber, the second group-III precursor comprising the second group-III element; and
    depositing the crystalline nitride layer over the substrate with a second thermal chemical-vapor-deposition process within the substrate processing chamber using the second group-III precursor and the second nitrogen precursor.

5. The method recited in claim 4 wherein the third temperature is greater than 900° C.

6. The method recited in claim 4 wherein the first and second group-III elements comprise Ga.

7. The method recited in claim 4 wherein the amorphous buffer layer and the crystalline nitride layer have substantially the same chemical composition.

8. The method recited in claim 4 further comprising:
    transferring the substrate from the substrate processing chamber to a second substrate processing chamber different from the substrate processing chamber;
    flowing a third group-III precursor and a third nitrogen precursor into the second substrate processing chamber, the third group-III precursor comprising a third group-III element different from the second group-III element; and
    depositing a second nitride layer over the crystalline nitride layer with a third chemical-vapor-deposition process within the second processing chamber using the third group-III precursor and the third nitrogen precursor.

9. The method recited in claim 1 wherein exposing the substrate to the corrosive agent comprises flowing a halogen precursor into the substrate processing chamber.

10. The method recited in claim 9 wherein the halogen precursor comprises HCl.

11. The method recited in claim 1 further comprising forming a second nitride layer over the crystalline nitride layer.

12. The method recited in claim 1 wherein the third temperature is approximately equal to the second temperature.

13. The method recited in claim 1 wherein the substrate comprises a sapphire substrate.

14. A method of fabricating a compound nitride semiconductor structure, the method comprising performing the following in the recited order:
    disposing a sapphire substrate within a substrate processing chamber;
    flowing a first gallium precursor and a first nitrogen precursor into the substrate processing chamber;
    depositing an amorphous buffer layer over the substrate with a first chemical-vapor-deposition process at a first temperature, the amorphous buffer layer comprising gallium and nitrogen;
    terminating flowing the first gallium precursor;
    increasing a temperature within the substrate processing chamber to a second temperature at which the amorphous buffer layer coalesces into a plurality of crystallites over the substrate;
    flowing a halogen precursor into the substrate processing chamber to destroy at least some of the crystallites;
    terminating flowing the halogen precursor;
    flowing a second gallium precursor into the substrate processing chamber; and
    depositing a crystalline nitride layer over the substrate with a second chemical-vapor deposition process at a third temperature that is greater than the first temperature, the crystalline nitride layer comprising gallium and nitrogen.

15. The method recited in claim 14 wherein the first temperature is less than 700° C.

16. The method recited in claim 15 wherein the third temperature is greater than 900° C.

17. The method recited in claim 16 wherein the third temperature is approximately equal to the second temperature.

18. The method recited in claim 14 further comprising:
transferring the substrate from the substrate processing chamber to a second substrate processing chamber different from the substrate processing chamber;
flowing a third gallium precursor and a third nitrogen precursor into the second substrate processing chamber, the third gallium precursor comprising gallium and a group-III element different from gallium; and
depositing a second nitride layer over the crystalline nitride layer with a third chemical-vapor-deposition process within the second processing chamber using the third gallium precursor and the third nitrogen precursor.

* * * * *